(12) United States Patent
Yamada et al.

(10) Patent No.: US 8,722,516 B2
(45) Date of Patent: May 13, 2014

(54) LASER PROCESSING METHOD AND METHOD FOR MANUFACTURING LIGHT-EMITTING DEVICE

(75) Inventors: Takeshi Yamada, Hamamatsu (JP); Masaharu Hoshikawa, Hamamatsu (JP); Yasunaga Nara, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 34 days.

(21) Appl. No.: 13/233,662

(22) Filed: Sep. 15, 2011

(65) Prior Publication Data

US 2012/0077296 A1    Mar. 29, 2012

Related U.S. Application Data

(60) Provisional application No. 61/387,173, filed on Sep. 28, 2010, provisional application No. 61/490,926, filed on May 27, 2011.

(51) Int. Cl.
*H01L 21/00* (2006.01)

(52) U.S. Cl.
USPC ............ 438/463; 257/E21.237; 257/E33.055; 438/33

(58) Field of Classification Search
CPC ...................... H01L 33/0095; H01L 21/67092
USPC .................. 438/33, 463; 219/121.67; 216/94; 257/E21.237, E33.055; 483/33, 463
See application file for complete search history.

(56) References Cited

U.S. PATENT DOCUMENTS

| | | | |
|---|---|---|---|
| 4,546,231 | A | 10/1985 | Gresser et al. |
| 6,992,026 | B2 | 1/2006 | Fukuyo et al. |
| 7,396,742 | B2 | 7/2008 | Fukuyo et al. |
| 7,489,454 | B2 | 2/2009 | Fukuyo et al. |
| 7,547,613 | B2 | 6/2009 | Fukuyo et al. |

(Continued)

FOREIGN PATENT DOCUMENTS

| | | |
|---|---|---|
| CN | 1160228 A | 9/1997 |
| JP | 2780618 | 5/1998 |

(Continued)

OTHER PUBLICATIONS

U.S. Appl. No. 13/206,181, filed Aug. 9, 2011.

(Continued)

*Primary Examiner* — Caridad Everhart
(74) *Attorney, Agent, or Firm* — Drinker Biddle & Reath LLP

(57) ABSTRACT

A plurality of modified parts are formed at a first formation pitch for a line arranged along the M-plane of a single-crystal sapphire substrate to construct a modified region and cause a fracture occurring from the modified region to reach a principal surface of the single-crystal sapphire substrate. A plurality of modified parts are formed at a second formation pitch narrower than the first formation pitch for a line arranged along the A-plane of the single-crystal sapphire substrate to construct a modified region and cause a fracture occurring from the modified region to reach the principal surface of the single-crystal sapphire substrate. Along the lines, a knife edge is pressed against a wafer from the side of the single-crystal sapphire substrate opposite from the principal surface of the single-crystal sapphire substrate where the fractures have reached, to cut the wafer along the lines.

12 Claims, 22 Drawing Sheets

(56) References Cited

U.S. PATENT DOCUMENTS

| | | |
|---|---|---|
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2004/0002199 A1 | 1/2004 | Fukuyo et al. |
| 2005/0202596 A1 | 9/2005 | Fukuyo et al. |
| 2005/0272223 A1 | 12/2005 | Fujii et al. |
| 2006/0011593 A1 | 1/2006 | Fukuyo et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0204412 A1* | 8/2011 | Sugano ............ 257/103 |
| 2011/0274128 A1 | 11/2011 | Fukumitsu et al. |
| 2011/0312115 A1* | 12/2011 | Kato ................ 438/33 |

FOREIGN PATENT DOCUMENTS

| | | | | |
|---|---|---|---|---|
| JP | 2001-156332 | | 6/2001 | |
| WO | WO2010050410 | * | 5/2010 | ............. H01L 33/32 |
| WO | WO2010101069 | * | 9/2010 | ............ H01L 21/301 |

OTHER PUBLICATIONS

U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
X. Liu et al., "Laser Ablation and Micromachining with Ultrashort Laser Pulses," IEEE Journal of Quantum Electronics, vol. 33, No. 10, Oct. 1997, pp. 1706-1716.

* cited by examiner (a)

(b)

(a)

(b)

ns No. 61/387,173 filed on Sep. 28, 2010 and No. 61/490,
LASER PROCESSING METHOD AND METHOD FOR MANUFACTURING LIGHT-EMITTING DEVICE

CROSS-REFERENCE TO RELATED APPLICATIONS

This application claims priority to Provisional Applications No. 61/387,173 filed on Sep. 28, 2010 and No. 61/490,926 filed on May 27, 2011 by the same Applicant, which are hereby incorporated by reference in their entirety.

BACKGROUND OF THE INVENTION

1. Field of the Invention

The present invention relates to a laser processing method and a method for manufacturing a light-emitting device.

2. Related Background Art

Techniques for highly precisely cutting a wafer having a multilayer structure in which a semiconductor operation layer made of a group III-V compound semiconductor such as GaN is grown as a crystal on a single-crystal sapphire substrate have recently been demanded for manufacturing semiconductor light-emitting devices such as semiconductor laser devices and light-emitting diodes.

For cutting a wafer having such a multilayer structure, blade dicing or diamond scribing has conventionally been used in general.

The blade dicing is a method of cutting the wafer by incising it with a diamond blade or the like. On the other hand, the diamond scribing is a method in which a diamond point tool forms a scribe line on the front face of the wafer, and a knife edge is pressed against the rear face of the wafer along the scribe line, so as to break and cut the wafer.

For example, Japanese Patent Publication No. 2780618 and Japanese Patent Application Laid-Open No. 2001-156332 disclose semiconductor light-emitting devices formed by combining such blade dicing and diamond scribing together.

SUMMARY OF THE INVENTION

However, methods combining the blade dicing and diamond scribing incur the following problems. Since a wafer including a single-crystal sapphire substrate has a high hardness and is hard to cleave, chipping and the like are likely to occur upon cutting the wafer when the diamond scribing is used for this wafer. When the single-crystal sapphire substrate is relatively thick, both faces of the wafer must be provided with scribe lines, whereby positional deviations between the scribe lines provided on both faces may result in defective cutting. Therefore, using the blade dicing together with the diamond scribing causes a problem that the wafer is hard to cut with a high precision.

On the other hand, using the blade dicing alone takes an enormous time for incising the single-crystal sapphire substrate having a high hardness, while the blade wears out so much that it must be replaced frequently, which causes another problem that the manufacturing efficiency worsens.

In view of such circumstances, it is an object of the present invention to provide a laser processing method and a method for manufacturing a light-emitting device which can overcome problems such as those mentioned above and cut a wafer including a single-crystal sapphire substrate efficiently with a high precision.

For achieving the above-mentioned object, the laser processing method in accordance with the present invention is a laser processing method for cutting a wafer including a single-crystal sapphire substrate having a C-plane as a principal surface along first and second lines to cut the wafer, the method comprising a first step of irradiating the single-crystal sapphire substrate with a pulsed laser light while locating a converging point within the substrate, and relatively moving the converging point of the pulsed laser light along the first line arranged along an M-plane of the single-crystal sapphire substrate, so as to form a first modified region within the single-crystal sapphire substrate along the first line; and a second step of irradiating the single-crystal sapphire substrate with the pulsed laser light while locating the converging point within the substrate, and relatively moving the converging point of the pulsed laser light along the second line arranged along an A-plane of the single-crystal sapphire substrate, so as to form a second modified region within the single-crystal sapphire substrate along the second line; wherein, in the first step, a modified part is formed by irradiation with one pulse of the pulsed laser light, and a plurality of the modified parts are arranged at a first formation pitch along the first line, so as to form the first modified region; and wherein, in the second step, a plurality of the modified parts are arranged with a second formation pitch narrower than the first formation pitch along the second line, so as to form the second modified region.

The inventor has found that, when a plurality of modified parts are formed for the second line arranged along the A-plane at the first formation pitch as for the first line arranged along the M-plane, fractures occurring from the modified region formed along the second line tend to meander greatly. Therefore, in the laser processing method in accordance with the present invention, a plurality of modified parts are formed at the first formation pitch for the first line arranged along the M-plane, and a plurality of modified parts are formed at the second formation pitch narrower than the first formation pitch for the second line arranged along the A-plane. Thus forming the modified parts inhibits both of fractures occurring from the first modified region formed along the first line and the second modified region formed along the second line from meandering. Therefore, the laser processing method in accordance with the present invention can cut a wafer containing a single-crystal sapphire substrate efficiently with a high precision.

The first line arranged along the M-plane encompasses not only the case where the first line is parallel to the M-plane, but also the case where it is tilted with respect to the M-plane by an angle within the range of ±10°. Similarly, the second line arranged along the A-plane encompasses not only the case where the second line is parallel to the A-plane, but also the case where it is tilted with respect to the A-plane by an angle within the range of ±10°. The second step may be carried out after the first step, or vice versa.

However, there is a case where it is preferred for the first step to be carried out after the second step. For the second line set along the A-plane, it is desirable that a plurality of modified parts be formed more precisely at the second formation pitch narrower than the first formation pitch as mentioned above. Therefore, forming the second modified region before forming the first modified region can prevent the first modified region from blocking the laser light irradiation for forming the second modified region in the part where the second line intersects the first line when forming the second modified region. This can more effectively inhibit fractures occurring from the second modified region formed along the second line from meandering.

Preferably, in the first step, the converging point of the pulsed laser light is relatively moved at a first relative speed along the first line, and in the second step, the converging point of the pulsed laser light is relatively moved at a second relative speed slower than the first relative speed along the second line. This can adjust the first formation pitch and the second formation pitch narrower than the first formation pitch easily and accurately.

Preferably, in the first step, the first modified region is formed within the single-crystal sapphire substrate such that a first fracture occurring from the first modified region reaches a laser light entrance surface of the wafer, and in the second step, the second modified region is formed within the single-crystal sapphire substrate such that a second fracture occurring from the second modified region reaches the laser light entrance surface of the wafer. This allows the wafer to be cut with a high precision by a relatively small force when a knife edge is pressed against the wafer along the first and second lines, for example.

Preferably, in this case, the method further comprises a third step of pressing a knife edge against the wafer along the first line from an opposite side of the laser light entrance surface, so as to cut the wafer along the first line, and a fourth step of pressing the knife edge against the wafer along the second line from the opposite side of the laser light entrance surface, so as to cut the wafer along the second line. In this case, the knife edge is pressed against the wafer from the opposite side of the laser light entrance surface where the first and second fractures have reached, whereby it becomes easier for the first and second fractures to extend to the opposite side of the laser light entrance surface by opening themselves. Therefore, the wafer can be cut with a higher precision by a smaller force. The fourth step may be carried out after the third step, or vice versa.

However, there is a case where it is preferred for the third step to be carried out after the fourth step. The inventor has found that a greater cutting force is required (the force required for cutting increases) when the second modified region formed along the A-plane is used as a cutting start point than when the first modified region formed along the M-plane is used as a cutting start point. Also, a greater cutting force is necessary when cutting the wafer along the second line in the state where the wafer has been cut along the first line than when cutting the wafer along the second line in the state where the wafer has not been cut along the first line. Therefore, cutting the wafer from the second modified region acting as a start point before cutting the wafer from the first modified region acting as a start point can reduce the force required for cutting the wafer along the second line and improve the precision of cutting the wafer along the second line.

On the other hand, there is a case where it is preferred for the fourth step to be carried out after the third step. Since a plurality of modified parts are formed for the first line at the first formation pitch wider than the second formation pitch, cutting the wafer along the first line in the state where the wafer has been cut along the second line may lower the precision of cutting the wafer along the first line. Since a plurality of modified parts are formed for the second line by the second formation pitch narrower than the first formation pitch, by contrast, cutting the wafer along the second line in the state where the wafer has been cut along the first line may inhibit the precision of cutting the wafer along the second line from decreasing. Therefore, cutting the wafer from the first modified region acting as a start point before cutting the wafer from the second modified region acting as a start point can improve the precision of cutting the wafer along the first line while inhibiting the precision of cutting the wafer along the second line.

The method for manufacturing a light-emitting device in accordance with the present invention is a method for manufacturing a plurality of light-emitting devices by cutting a wafer along first and second lines to cut the wafer, the wafer including a single-crystal sapphire substrate having a C-plane as a principal surface and a semiconductor layer made of a group III-V compound semiconductor and laminated on one principal surface of the single-crystal sapphire substrate, the method comprising a first step of irradiating the single-crystal sapphire substrate with a pulsed laser light while locating a converging point within the substrate and, relatively moving the converging point of the pulsed laser light along the first line arranged along an M-plane of the single-crystal sapphire substrate, so as to form a first modified region within the single-crystal sapphire substrate along the first line such that a first fracture occurring from the first modified region reaches the other principal surface of the single-crystal sapphire substrate; a second step of irradiating the single-crystal sapphire substrate with the pulsed laser light while locating the converging point within the substrate, and relatively moving the converging point of the pulsed laser light along the second line arranged along an A-plane of the single-crystal sapphire substrate, so as to form a second modified region within the single-crystal sapphire substrate along the second line such that a second fracture occurring from the second modified region reaches the other principal surface of the single-crystal sapphire substrate; a third step of pressing a knife edge against the wafer along the first line from the semiconductor layer side, so as to cut the wafer along the first line; and a fourth step of pressing the knife edge against the wafer along the second line from the semiconductor layer side, so as to cut the wafer along the second line; wherein, in the first step, a modified part is formed by irradiation with one pulse of the pulsed laser light, and a plurality of the modified parts are arranged at a first formation pitch along the first line, so as to form the first modified region; and wherein, in the second step, a plurality of the modified parts are arranged with a second formation pitch narrower than the first formation pitch along the second line, so as to form the second modified region.

Because of the same reason as with the above-mentioned laser processing method, the light-emitting device manufacturing method in accordance with the present invention can inhibit both of fractures occurring from the first modified region formed along the first line and the second modified region formed along the second line from meandering. Further, since the knife edge is pressed against the wafer from the opposite side of the principal surface where the first and second fractures have reached, it is easier for the first and second fractures to extend to the opposite side of the laser light entrance surface by opening themselves. Therefore, the light-emitting device manufacturing method in accordance with the present invention can cut the wafer including the single-crystal sapphire substrate efficiently with a high precision, so as to yield light-emitting devices with a high quality.

The first line arranged along the M-plane encompasses not only the case where the first line is parallel to the M-plane, but also the case where it is tilted with respect to the M-plane by an angle within the range of ±10°. Similarly, the second line arranged along the A-plane encompasses not only the case where the second line is parallel to the A-plane, but also the case where it is tilted with respect to the A-plane by an angle within the range of ±10°. The second step may be carried out after the first step, or vice versa. Similarly, the fourth step may be carried out after the third step, or vice versa.

The semiconductor layer laminated on one principal surface of the single-crystal sapphire substrate may encompass those disposed in close contact with the substrate and those forming a gap with the substrate. Its examples include semiconductor operation layers formed by crystal growth on the single-crystal sapphire substrate and semiconductor layers fixed onto the single-crystal sapphire substrate after being laminated separately from the substrate. The term "within the substrate" is meant to include the principal surface of the single-crystal sapphire substrate provided with the semiconductor layer as well.

However, there is a case where it is preferred for the first step to be carried out after the second step. For the second line set along the A-plane, it is desirable that a plurality of modified parts be formed more precisely at the second formation pitch narrower than the first formation pitch as mentioned above. Therefore, forming the second modified region before forming the first modified region can prevent the first modified region from blocking the laser light irradiation for forming the second modified region in the part where the second line intersects the first line when forming the second modified region. This can more effectively inhibit fractures occurring from the second modified region formed along the second line from meandering.

Preferably, in the first step, the converging point of the pulsed laser light is relatively moved at a first relative speed along the first line, and in the second step, the converging point of the pulsed laser light is relatively moved at a second relative speed slower than the first relative speed along the second line. This can adjust the first formation pitch and the second formation pitch narrower than the first formation pitch easily and accurately.

There is a case where it is preferred for the third step to be carried out after the fourth step. In this case, cutting the wafer from the second modified region acting as a start point before cutting the wafer from the first modified region acting as a start point can reduce the force required for cutting the wafer along the second line and improve the precision of cutting the wafer along the second line.

On the other hand, there is a case where it is preferred for the fourth step to be carried out after the third step. In this case, cutting the wafer from the first modified region acting as a start point before cutting the wafer from the second modified region acting as a start point can improve the precision of cutting the wafer along the first line while inhibiting the precision of cutting the wafer along the second line from decreasing.

DESCRIPTION OF THE PREFERRED EMBODIMENTS

In the following, a preferred embodiment of the present invention will be explained in detail with reference to the drawings. The light-emitting device manufacturing method in accordance with this embodiment irradiates a wafer with a laser light which is transmitted through the front face of a substrate of the wafer, so as to form a modified region to become a cutting start point within the substrate of the wafer.

Figure 1:
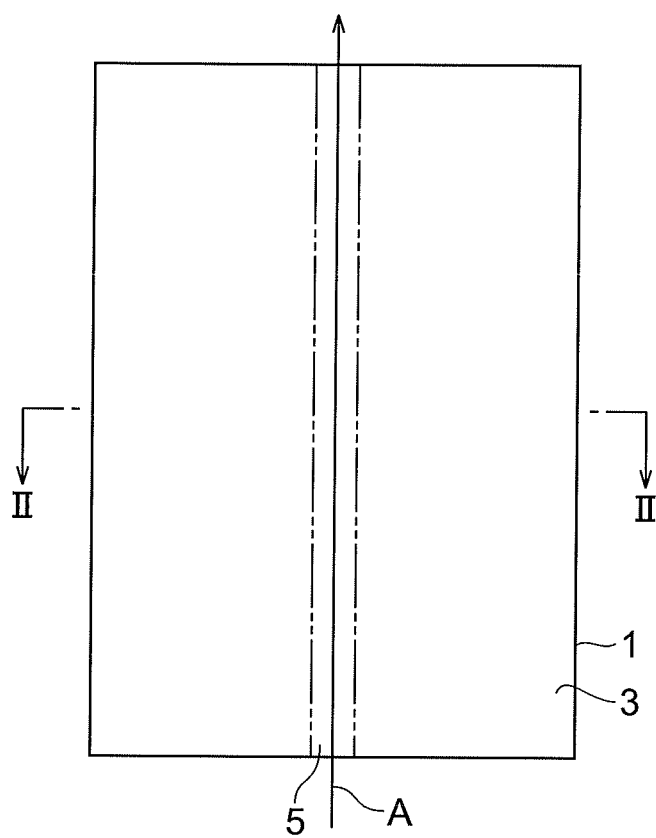
FIG. 1 is a plan view of a substrate during laser processing.
Figure 2:
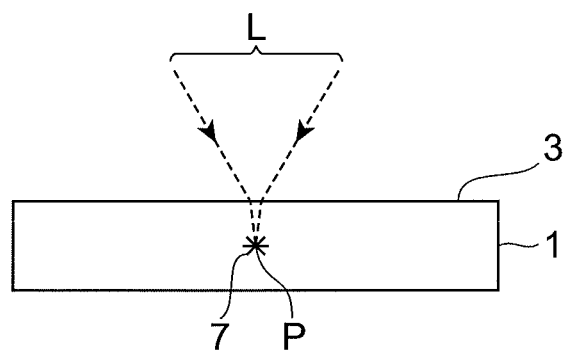
FIG. 2 is a sectional view taken along the line II-II of the substrate illustrated in FIG. 1.
Figure 3:
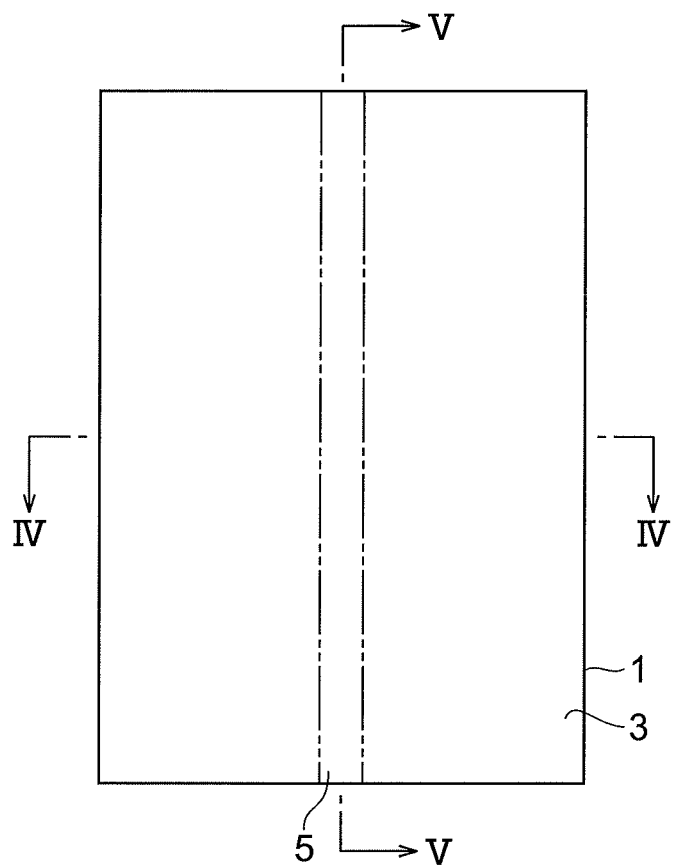
FIG. 3 is a plan view of the substrate after the laser processing.
Figure 4:
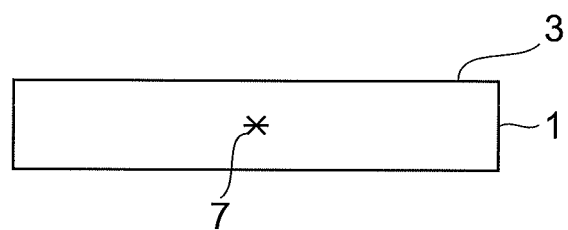
FIG. 4 is a sectional view taken along the line IV-IV of the substrate illustrated in FIG. 3.
Figure 5:
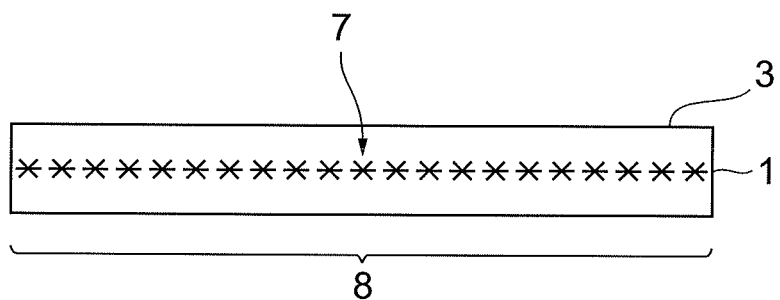
FIG. 5 is a sectional view taken along the line V-V of the substrate illustrated in FIG. 3.

The principle of this laser processing will be explained with reference to FIGS. 1 to 6. FIG. 1 is a plan view of a substrate 1 during laser processing; FIG. 2 is a sectional view of the substrate 1 taken along the line II-II of FIG. 1; FIG. 3 is a plan view of the substrate 1 after the laser processing; FIG. 4 is a sectional view of the substrate 1 taken along the line IV-IV of FIG. 1; FIG. 5 is a sectional view of the substrate 1 taken along the line V-V of FIG. 1; and FIG. 6 is a plan view of the cut substrate 1.

As illustrated in FIGS. 1 and 2, a desirable line to cut 5 is arranged on the substrate 1. The line 5 is a linearly extending virtual line, which is a boundary line between chips when dividing a wafer into a plurality of chips in this embodiment. A line may actually be drawn on the wafer as the line 5. In this embodiment, the substrate 1 is irradiated with a laser light L1 while locating a converging point P therewithin, so as to form a modified region 7. The converging point P is a position at which the laser light L is converged.

The laser light L is relatively moved along the line 5 (i.e., along the direction of arrow A), so as to shift the converging point P along the line 5. This forms the modified region 7 only within the substrate 1 along the line 5 as illustrated in FIGS. 3 to 5, while the modified region 7 constitutes a starting point region for cutting 8. This laser processing method does not form the modified region 7 by the heat generated by the substrate 1 absorbing the laser light L1. It lets the substrate 1 transmit the laser light L1 therethrough, so that absorption such as multiphoton absorption or absorption caused by two-step excitation or changes in absorption coefficient is generated within the substrate 1, whereby the modified region 7 is formed. Hence, the front face 3 of the substrate 1 hardly absorbs the laser light L and thus will not melt.

Figure 6:
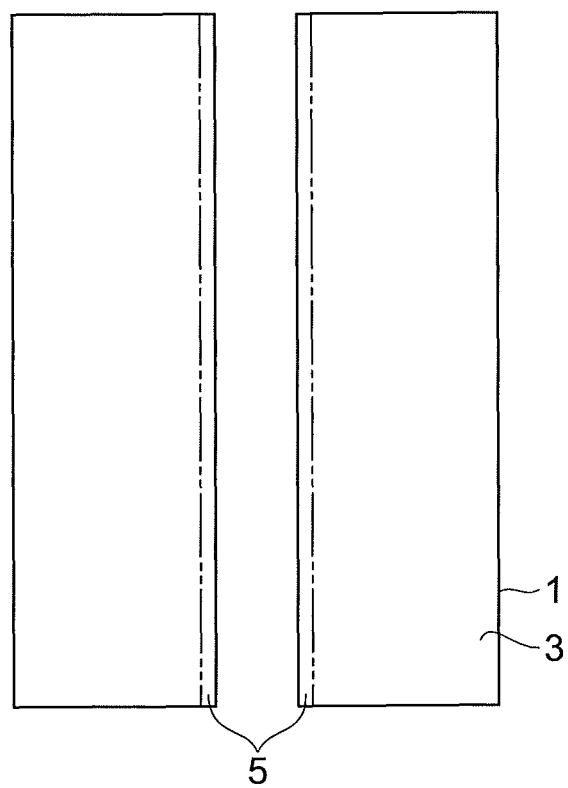
FIG. 6 is a plan view of the cut substrate.

When being cut, the substrate 1 breaks from a start point, if any, existing in a part to cut and thus can be cut with a relatively small force as illustrated in FIG. 6. As a consequence, the substrate 1 can be cut efficiently without generating unnecessary fractures such as chipping on the front face 3 of the substrate 1.

There seem to be the following two ways of cutting the substrate from the starting point region for cutting acting as a start point. One is where an artificial force is applied to the substrate after the starting point region for cutting is formed, so that the substrate breaks from the starting point region for cutting acting as a start point, whereby the substrate is cut. This is the cutting in the case where the substrate has a large thickness, for example. Applying an artificial force refers to exerting a bending stress or shear stress to the substrate along the starting point region for cutting thereof, or generating a thermal stress by applying a temperature difference to the substrate, for example. The other is where the forming of the starting point region for cutting causes the substrate to break naturally in its cross-sectional direction (thickness direction) from the starting point region for cutting acting as a start point, whereby the substrate is cut. This becomes possible if the starting point region for cutting is formed by one row of the modified region when the substrate has a small thickness, or if the starting point region for cutting is formed by a plurality of rows of the modified region in the thickness direction when the substrate has a large thickness. Even in this naturally breaking case, fractures do not extend onto the front face at a portion corresponding to an area not formed with the starting point region for cutting in the part to cut, so that only the portion corresponding to the area formed with the starting point region for cutting can be cleaved, whereby cleavage can be controlled well. Such a cleaving method with a favorable controllability is very effective, since substrates such as those of wafers have recently been apt to decrease their thickness.

Here, examples of the reformed region formed within the substrate include crack regions, molten processed regions, and refractive index changed regions.

For example, a substrate made of sapphire, glass, or the like is irradiated with a laser light while locating a converging point within the substrate under a condition with a peak power density of at least $1 \times 10^8$ (W/cm$^2$) at the converging point and a pulse width of 1 µs or less. This may form a crack region only within the substrate without unnecessarily damaging the front face of the substrate. That is, a phenomenon known as optical damage occurs within the substrate, so as to induce distortion within the substrate, thereby forming a crack region within the substrate. The pulse width is preferably 1 femtosecond to 1 ns or less, for example.

Figure 7:
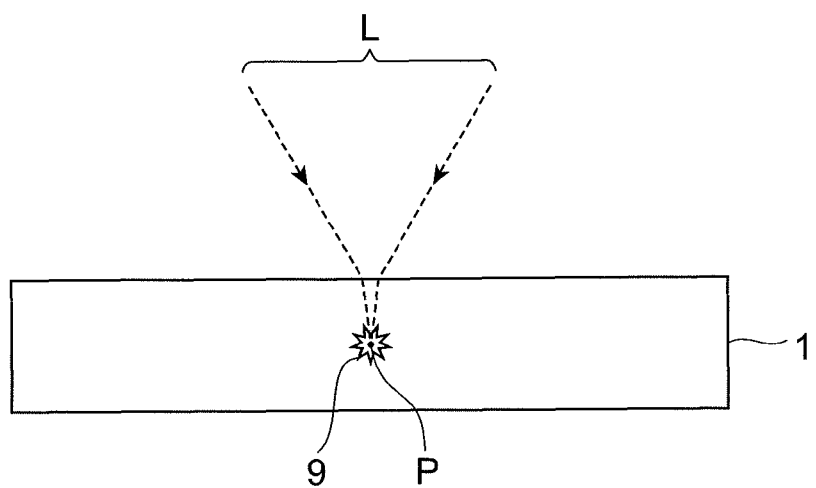
FIG. 7 is a sectional view of the substrate in a first step of a laser processing method used in an embodiment.
Figure 8:
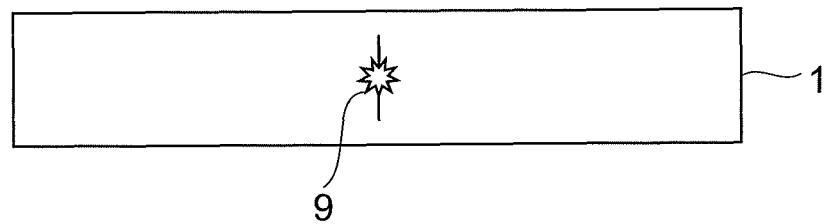
FIG. 8 is a sectional view of the substrate in a second step of the laser processing method used in the embodiment.
Figure 9:
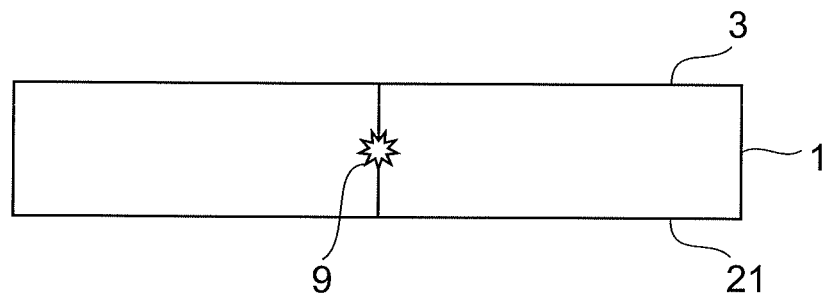
FIG. 9 is a sectional view of the substrate in a third step of the laser processing method used in the embodiment.
Figure 10:
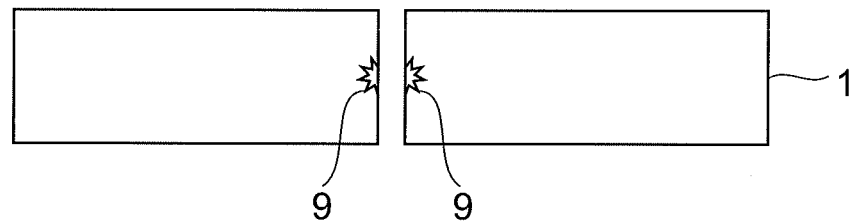
FIG. 10 is a sectional view of the substrate in a fourth step of the laser processing method used in the embodiment.

A mechanism of cutting a substrate by forming a crack region will now be explained with reference to FIGS. 7 to 10. As illustrated in FIG. 7, the substrate 1 is irradiated with the laser light L while locating the converging point P within the substrate 1, so as to form a crack region 9 therewithin. The crack region 9 is a region including one or a plurality of cracks. The crack region 9 forms a starting point region for cutting. As illustrated in FIG. 8, the crack further grows from the crack region 9 acting as a start point (i.e., from the starting point region for cutting acting as a start point), so as to reach the front and rear faces 3, 21 of the substrate 1 as illustrated in FIG. 9, thus breaking the substrate 1 as illustrated in FIG. 10, thereby cutting the substrate 1. The cracks reaching the front and rear faces of the substrate may grow naturally or as a force is exerted on the substrate.

A substrate made of a semiconductor material such as silicon, for example, is irradiated with a laser light while locating a converging point within the substrate under a condition with a peak power density of at least $1 \times 10^8$ (W/cm$^2$) at the converging point and a pulse width of 1 µs or less. This locally heats the inside of the substrate by absorption. This heating forms a molten processed region within the substrate. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among single-crystal, amorphous, and polycrystal structures. For example, it means a region having changed from the single-crystal structure to the amorphous structure, a region having changed from the single-crystal structure to the polycrystal structure, or a region having changed from the single-crystal structure to a structure containing amorphous and polycrystal structures. When the substrate is of a silicon single-crystal structure, the molten processed region is an amorphous silicon structure, for example. For semiconductor materials, the pulse width is preferably 1 ns to 1 µs, for example. The above-mentioned molten processed region can be formed not only in silicon but also in sapphire, for example, for which the pulse width is preferably 1 ns or less.

A fracture is generated from a starting point region for cutting formed in the molten processed region acting as a start point so as to extend along cross-sectional directions and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer includes both of cases where the fracture grows from a state in which the molten processed region forming the starting point region for cutting is molten and where the fracture grows when the molten processed region forming the starting point region for cutting is re-solidified from the molten state. In either case, the molten processed region is formed only within the silicon wafer and, when at a cut section, only within the cut section. When the starting point region for cutting is formed by the molten processed region within the substrate, unnecessary fractures deviating from the starting point region for cutting lines are less likely to occur at the time of cleaving, whereby the cleavage control becomes easier.

A substrate made of glass or the like, for example, is irradiated with a laser light while locating a converging point within the substrate under a condition with a peak power density of at least $1 \times 10^8$ (W/cm$^2$) at the converging point and a pulse width of 1 ns or less. When the laser light is absorbed within the substrate while having a very short pulse width, its energy is not converted into thermal energy, but induces an eternal structure change such as ion valence change, crystallization, or orientation polarization within the substrate, thus forming a refractive index changed region. The pulse width is preferably 1 ns or less, for example, more preferably 1 ps or less.

Though specific examples of the modified region formed within the substrate have been explained in the foregoing, a plurality of kinds of modified regions may be formed, e.g., a modified processed region and a crack region may be formed at the same time. It will be sufficient if the modified region formed by laser irradiation is a region to become a start point for cutting the substrate (a region which makes the substrate easier to break than when it is not formed).

That is, in the case of a substrate made of a single-crystal semiconductor having a diamond structure such as silicon, it will be preferred if the starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if the starting point region for cutting is formed in a direction extending along a (110) plane. In the case of a substrate having a crystal structure of hexagonal system such as sapphire, it will be preferred if the starting point region for cutting is formed in a direction extending along a (1120) plane (A-plane) or a (1100) plane (M-plane) while using a (0001) plane (C-plane) as a principal surface.

When the substrate is formed with an orientation flat (which will be explained later) in a direction to be formed with the above-mentioned starting point region for cutting (e.g., a direction extending along a (111) plane in a single-crystal silicon substrate) or a direction orthogonal to the direction to be formed therewith, the modified region can be formed easily and accurately in the substrate with reference to the orientation flat.

Figure 11:
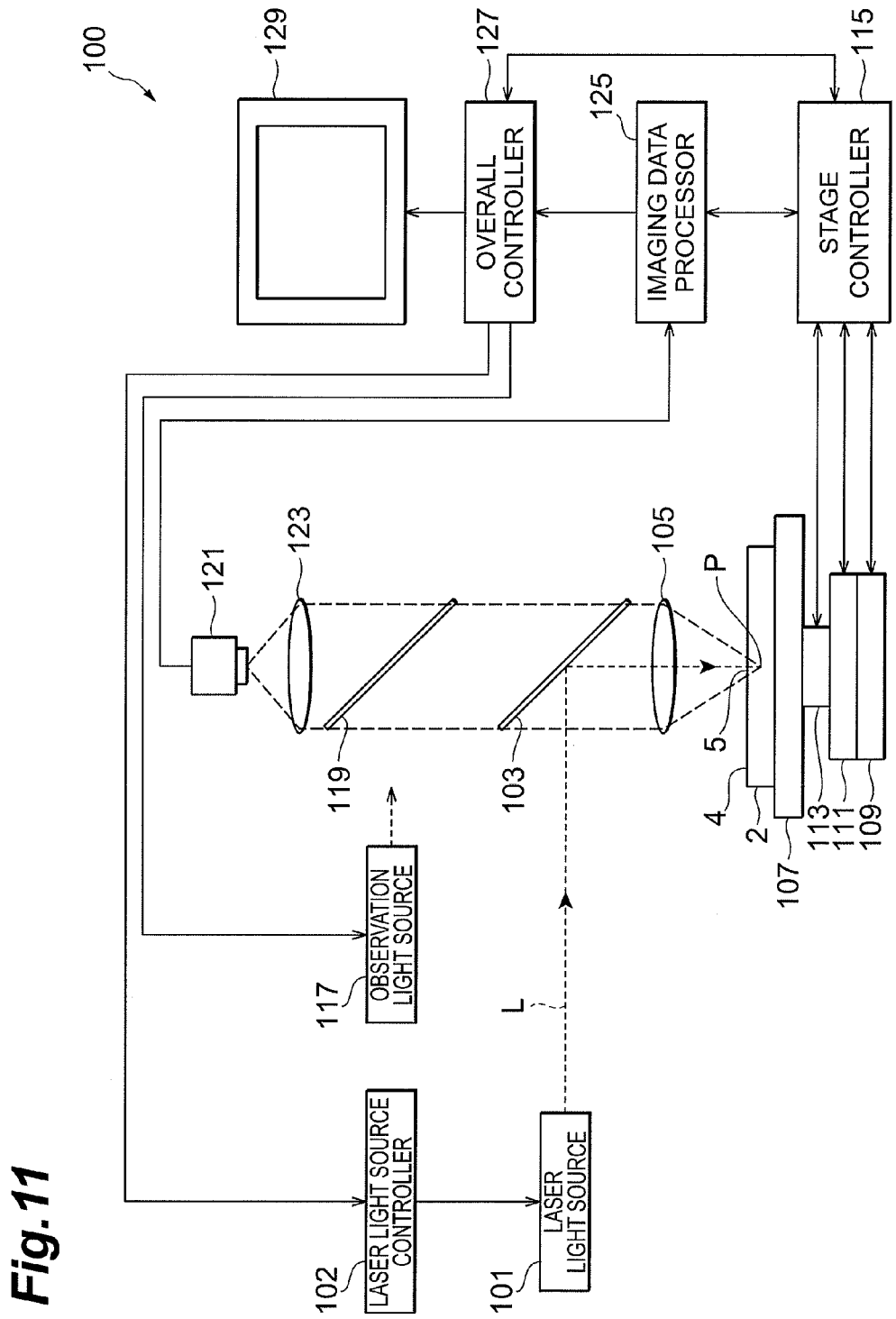
FIG. 11 is a schematic structural diagram of a laser processing apparatus.

A laser processing apparatus used in the above-mentioned laser processing method will now be explained with reference to FIG. 11. FIG. 11 is a schematic structural diagram of a laser processing apparatus 100.

The laser processing apparatus 100 comprises a laser light source 101 for generating the laser light L; a laser light source controller 102 for regulating the laser light source 101 in order to adjust the output, pulse width, and the like of the laser light L; a dichroic mirror 103 which functions to reflect the laser light L and is arranged such as to change the direction of the optical axis of the laser light L by 90°; a condenser lens 105 for converging the laser light L reflected by the dichroic mirror 103; a mount table 107 for mounting a wafer 2 irradiated with the laser light L converged by the condenser lens 105; an X-axis stage 109 for moving the mount table 107 along an X axis; a Y-axis stage 111 for moving the mount table 107 along a Y axis orthogonal to the X axis; a Z-axis stage 113 for moving the mount table 107 along a Z axis orthogonal to the X and Y axes; and a stage controller 115 for regulating the movements of the three stages 109, 111, 113.

The movement of the converging point P along the X (Y) axis is carried out by causing the X (Y)-axis stage 109 (111) to move the substrate 1 along the X (Y) axis. The Z axis is orthogonal to the front face 4 of the wafer 2 and thus is the focal depth direction of the laser light L incident on the wafer 2. Therefore, moving the Z-axis stage 113 along the Z axis can locate the converging point P of the laser light L within the substrate of the wafer 2. This can place the converging point P at a desirable position which is inside of the laser light entrance surface by a predetermined distance.

The laser light source 101 is an Nd:YAG laser which generates a pulsed laser light. Other examples of the laser usable in the laser light source 101 include Nd:YVO$_4$, Nd:YLF, and titanium sapphire lasers.

The laser processing apparatus 100 further comprises an observation light source 117 for generating a visible light beam in order to illuminate the wafer 2 mounted on the mount table 107 with the visible light beam, and a beam splitter 119 for visible light which is disposed on the same optical axis as with the dichroic mirror 103 and the condenser lens 105. The dichroic mirror 103 is disposed between the beam splitter 119 and the condenser lens 105. The beam splitter 119 functions to reflect about half of the visible light beam and transmits the remaining half therethrough and is arranged such as to change the direction of the optical axis of the visible light beam by 90°. About half of the visible light beam generated by the observation light source 117 is reflected by the beam splitter 119, and thus reflected part of the visible light beam passes through the dichroic mirror 103 and the condenser lens 105, so as to illuminate the front face 4 of the wafer 2 including the line 5 and the like. When the wafer 2 is mounted on the mount table 107 such that the rear face of the wafer 2 opposes the condenser lens 105, the "front face" mentioned above becomes the "rear face" as a matter of course.

The laser processing apparatus 100 further comprises an imaging device 121 and an imaging lens 123 which are disposed on the same optical axis as with the beam splitter 119, dichroic mirror 103, and condenser lens 105. An example of the imaging device 121 is a CCD camera. Reflected light of the visible light beam illuminating the front face 4 of the wafer 2 including the line 5 and the like is transmitted through the condenser lens 105, dichroic mirror 103, and beam splitter 119, so as to be focused by the imaging lens 123 and captured by the imaging device 121, thus yielding imaging data.

The laser processing apparatus 100 further comprises an imaging data processor 125 for receiving the imaging data issued from the imaging device 121, an overall controller 127 for regulating the laser processing apparatus 100 as a whole, and a monitor 129. According to the imaging data, the imaging data processor 125 computes focusing data for locating a focal point of the visible light generated by the observation light source 117 onto the front face 4 of the wafer 2. The stage controller 115 regulates the movement of the Z-axis stage according to the focusing data, so as to locate the focal point of the visible light onto the front face 4 of the wafer 2. Therefore, the imaging data processor 125 functions as an autofocus unit. According to the imaging data, the imaging data processor 125 also computes image data such as enlarged images of the front face 4 and the like. The image data is fed to the overall controller 127, subjected to various processing operations therein, and then sent to the monitor 129. As a consequence, the enlarged images and the like are displayed on the monitor 129.

The overall controller 127 receives data from the stage controller 115, image data from the imaging data processor 125, and the like and regulates the laser light source controller 102, observation light source 117, and stage controller 115 according to these data as well, thereby controlling the laser processing apparatus 100 as a whole. Hence, the overall controller 127 functions as a computer unit.

A light-emitting device manufacturing method using the above-mentioned laser processing method and laser processing apparatus 100 will now be explained. Here, a light-emitting diode is manufactured as the light-emitting device.

Figure 12:
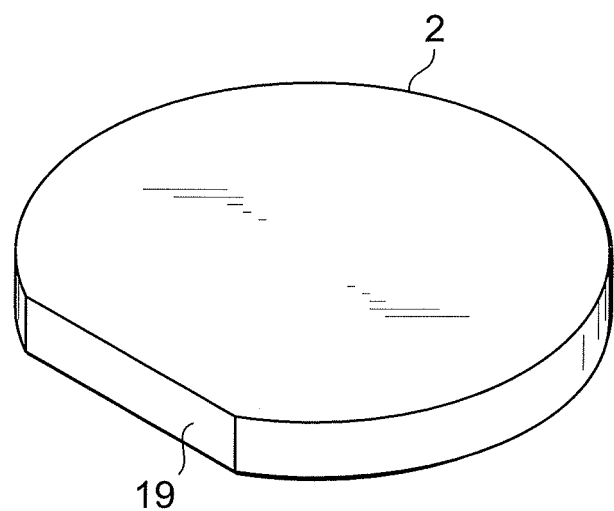
FIG. 12 is a perspective view of a wafer used in the light-emitting device manufacturing method in accordance with an embodiment.
Figure 13:
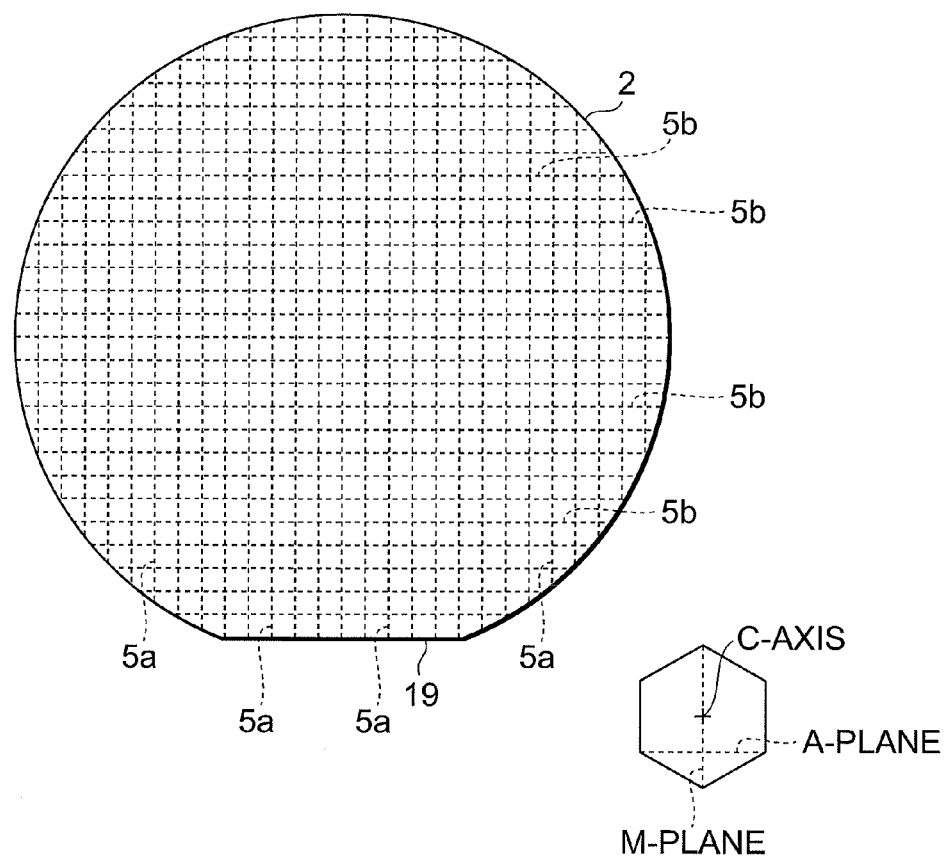
FIG. 13 is a plan view of the wafer illustrated in FIG. 12.
Figure 14:
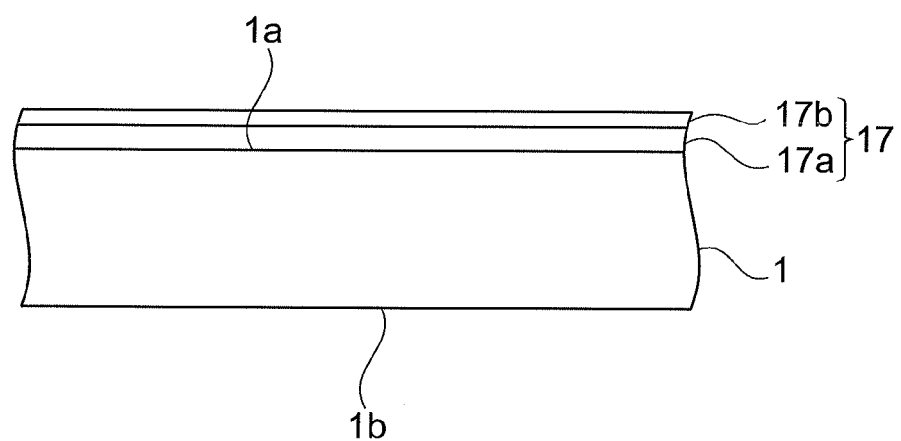
FIG. 14 is a partially sectional view of the wafer illustrated in FIG. 13.

As illustrated in FIGS. 12 to 14, the wafer 2 includes a single-crystal sapphire substrate 1 and a semiconductor layer 17 laminated on one principal surface 1a of the single-crystal sapphire substrate 1. The single-crystal sapphire substrate 1 is formed into a disk whose C-plane serves as principal surfaces 1a, 1b. The M-plane of the single-crystal sapphire substrate 1 is substantially perpendicular to an orientation flat (hereinafter referred to as "OF") 19, while the A-plane of the single-crystal sapphire substrate 1 is substantially parallel to the OF 19.

The semiconductor layer 17 has an n-type semiconductor layer 17a which is a first conduction type semiconductor layer laminated on the principal surface 1a of the single-crystal sapphire substrate 1 and a p-type semiconductor layer 17b which is a second conduction type semiconductor layer laminated on the n-type semiconductor layer 17a. The n-type semiconductor layer 17a and the p-type semiconductor layer 17b are made of a group III-V compound semiconductor such as GaN, for example, and are pn-joined to each other.

For efficiently dissipating the heat generated in the n-type semiconductor layer 17a and p-type semiconductor layer 17b, the thickness of the single-crystal sapphire substrate 1 is 50 to 200 μm, preferably 50 to 150 μm. The thickness of the n-type semiconductor layer 17a is 6 μm, for example, while the thickness of the p-type semiconductor layer 17b is 1 μm, for example.

Thus constructed wafer 2 is cut along lines to cut 5a, 5b into chips, so as to manufacture a plurality of light-emitting diodes (light-emitting devices). The lines 5a, 5b are arranged like grids at intervals of 2 mm, for example, for the wafer 2. A plurality of lines 5a to cut the wafer 2 are arranged along the M-plane of the single-crystal sapphire substrate 1, while a plurality of lines 5b to cut the wafer 2 are arranged along the A-plane of the single-crystal sapphire substrate 1.

Figure 15:
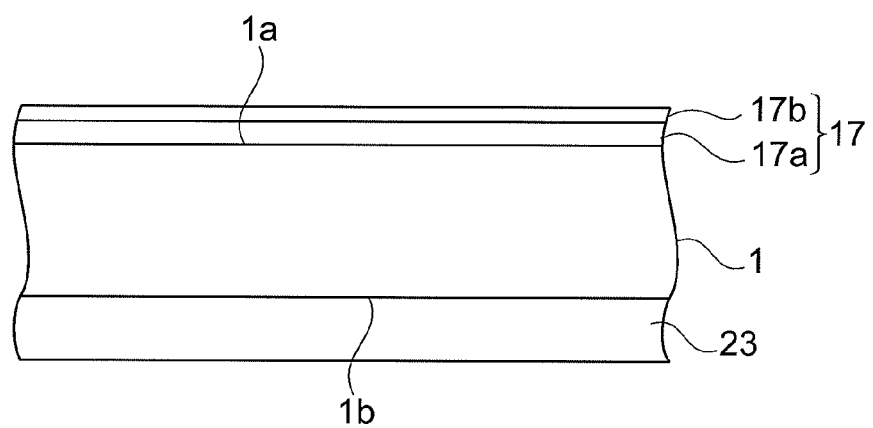
FIG. 15 is a partially sectional view of the wafer for explaining the light-emitting device manufacturing method.
Figure 16:
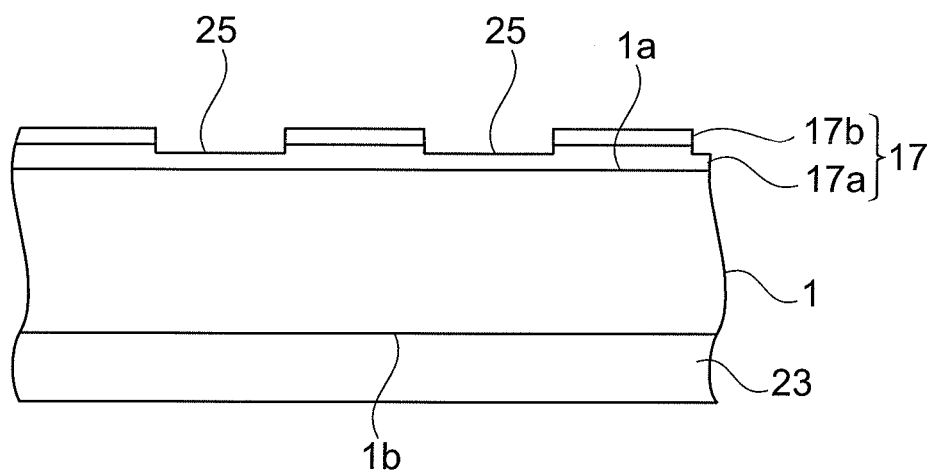
FIG. 16 is a partially sectional view of the wafer for explaining the light-emitting device manufacturing method.

First, as illustrated in FIG. 15, a protective tape 23 is attached to the other principal surface 1b of the single-crystal sapphire substrate 1. Subsequently, as illustrated in FIG. 16, the semiconductor layer 17 is etched along the lines 5a, 5b, so as to form grooves 25. Here, each groove 25 is formed with such a depth as to extend from the p-type semiconductor layer 17b to somewhere within the n-type semiconductor layer 17a. The groove 25 is formed with such a width that the p-type semiconductor layer 17b attains a desirable form and size and that a space for providing an electrode electrically connected to the n-type semiconductor layer 17a can be secured on the bottom face of the groove 25 after dividing the wafer 2 into chips.

The etching method includes wet etching and dry etching, any of which may be used for forming the grooves 25. An example of the wet etching is etching with a mixed acid composed of phosphoric acid and sulfuric acid. Examples of the dry etching include reactive ion etching (RIE), reactive ion beam etching (RIB), and ion milling. The grooves 25 may also be formed by blade dicing and the like, for example, instead of etching.

Figure 17:
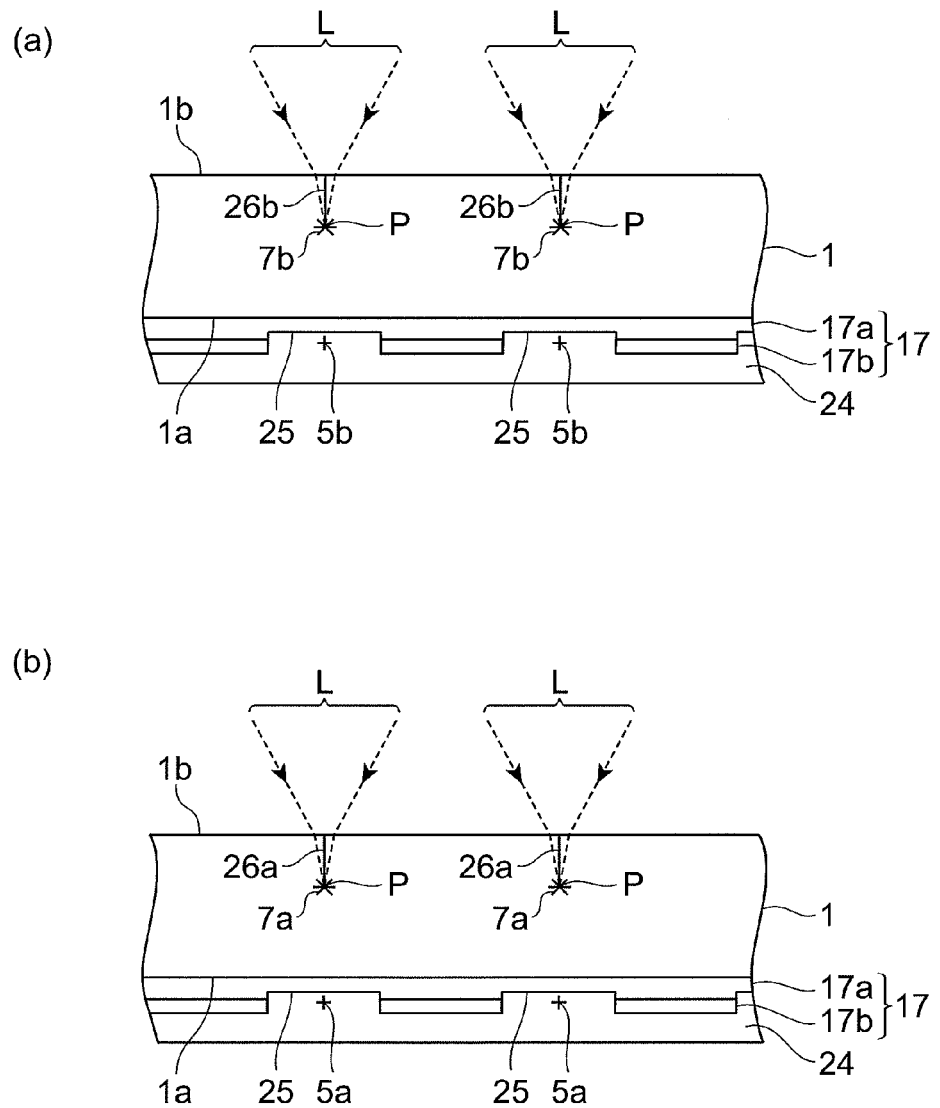
FIG. 17 is a partially sectional view of the wafer for explaining the light-emitting device manufacturing method.

Subsequently, as illustrated in FIG. 17, a protective tape 24 is attached to the wafer 2 so as to cover the semiconductor layer 17, and the protective tape 23 is removed from the principal surface 1b of the single-crystal sapphire substrate 1. Then, the wafer 2 is disposed on the mount table 107 of the laser processing apparatus 100 such that the principal surface 1b of the single-crystal sapphire substrate 1 opposes the condenser lens 105.

As illustrated in FIG. 17(a), the single-crystal sapphire substrate 1 is irradiated with the pulsed laser light L while locating the converging point P within the single-crystal sapphire substrate 1 and moving the converging point P of the pulsed laser light L along the line 5b arranged along the A-plane of the single-crystal sapphire substrate 1. Here, the mount table 107 is shifted such that the converging point P of the pulsed laser light L relatively moves along the line 5b at a second relative speed slower than the after-mentioned first relative speed.

The irradiation with the pulsed laser light L forms a modified region 7b within the single-crystal sapphire substrate 1 and causes a fracture 26b occurring from the modified region 7b to reach the principal surface 1b serving as the laser light entrance surface of the single-crystal sapphire substrate 1. The modified region 7b becomes a starting point region for cutting at the time of cutting the wafer 2 along the line 5b. Here, the "fracture" is meant to include the above-mentioned "crack" and the like.

Here, the distance from the principal surface 1b to the converging point P of the pulsed laser light L is set such that the fracture 26b occurring from the modified region 7b when the modified region 7b is formed reaches the principal surface 1b of the single-crystal sapphire substrate 1. That is, the modified region 7b is formed within the single-crystal sapphire substrate 1 along the line 5b such that the fracture 26b occurring from the modified region 7b reaches the principal surface 1b of the single-crystal sapphire substrate 1.

While a modified part is formed by irradiation with one pulse of the pulsed laser light L, the modified region 7b is formed by arranging a plurality of modified parts along the line 5b at a second formation pitch smaller than the after-mentioned first formation pitch. The second formation pitch is a value obtained by dividing the second relative speed by the repetition frequency of the pulsed laser light L. For example, letting the second relative speed be 600 mm/sec, and the repetition frequency of the pulsed laser light L be 100 kHz, the second formation pitch is 6 μm (=600 mm/sec/100 kHz).

Subsequently, as illustrated in FIG. 17(b), the single-crystal sapphire substrate 1 is irradiated with the pulsed laser light L while locating the converging point P therewithin and relatively moving the converging point P along the line 5a arranged along the M-plane of the single-crystal sapphire substrate 1. Here, the mount table 107 is shifted such that the converging point P of the pulsed laser light L relatively moves along the line 5a at a first relative speed.

The irradiation with the pulsed laser light L forms a modified region 7a within the single-crystal sapphire substrate 1 and causes a fracture 26a occurring from the modified region 7a to reach the principal surface 1b serving as the laser light entrance surface of the single-crystal sapphire substrate 1. The modified region 7a becomes a starting point region for cutting at the time of cutting the wafer 2 along the line 5a.

The distance from the principal surface 1b of the single-crystal sapphire substrate 1 to the converging point P of the pulsed laser light L is set such that the fracture 26a occurring from the modified region 7a when the modified region 7a is formed within the single-crystal sapphire substrate 1 reaches the principal surface 1b of the single-crystal sapphire substrate 1. That is, the modified region 7a is formed within the single-crystal sapphire substrate 1 along the line 5a such that the fracture 26a occurring from the modified region 7a reaches the principal surface 1b of the single-crystal sapphire substrate 1.

While a modified part is formed by irradiation with one pulse of the pulsed laser light L, the modified region 7a is formed by arranging a plurality of modified parts along the line 5a at a first formation pitch. The first formation pitch is a value obtained by dividing the first relative speed by the repetition frequency of the pulsed laser light L. For example, letting the first relative speed be 1000 mm/sec, and the repetition frequency of the pulsed laser light L be 100 kHz, the first formation pitch is 10 μm (=1000 mm/sec/100 kHz).

Figure 18:
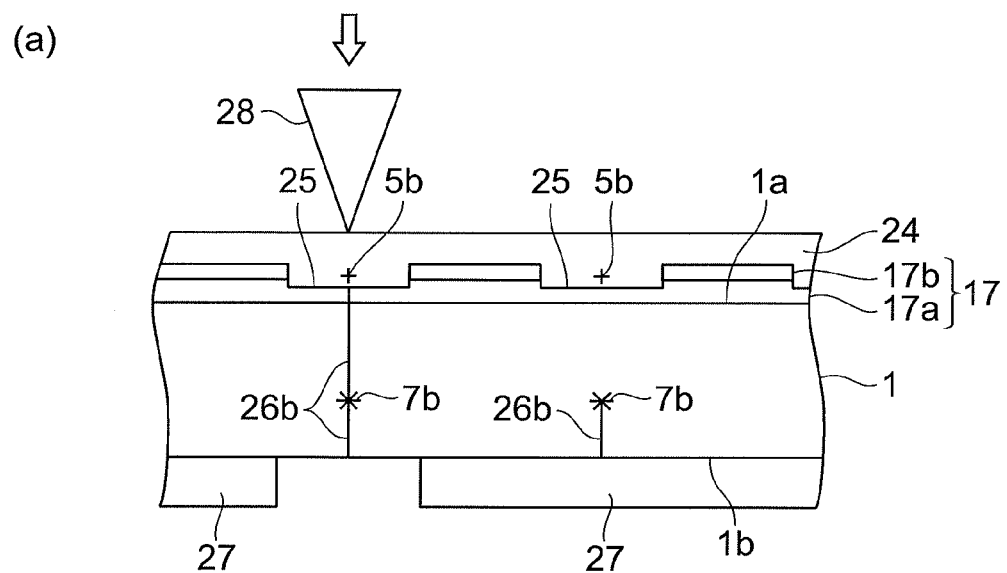
FIG. 18 is a partially sectional view of the wafer for explaining the light-emitting device manufacturing method.
Figure 18:
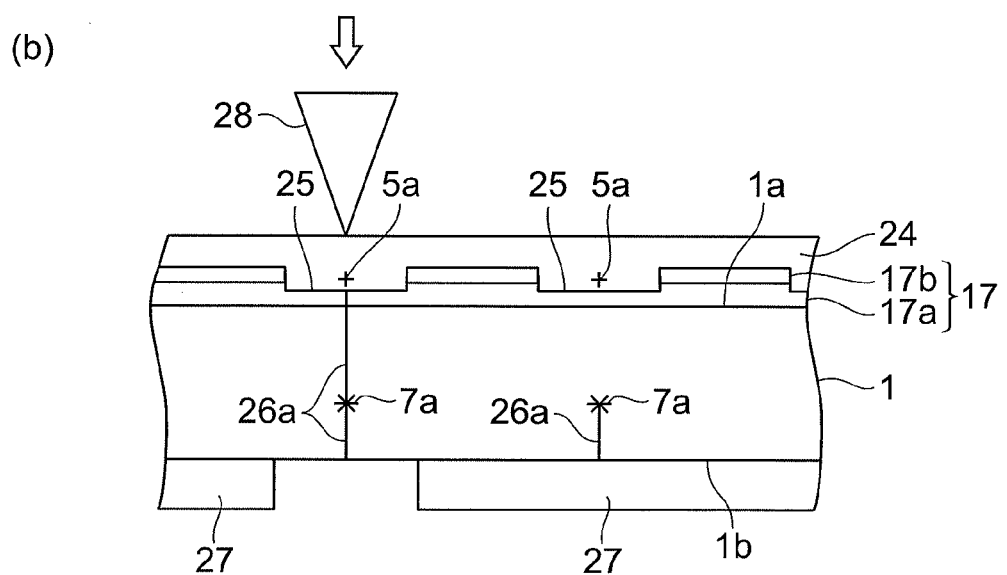

Next, as illustrated in FIG. 18(a), the wafer 2 is arranged in a three-point bending breaking apparatus, and a support member 27 is brought into contact with the principal surface 1b of the single-crystal sapphire substrate 1. Then, a knife edge 28 is pressed against the wafer 2 from the semiconductor layer 17 side through the protective tape 24 along the line 5b. This lets the fracture 26b extend to the semiconductor layer 17 side and divides the semiconductor layer 17 together with the single-crystal sapphire substrate 1. That is, the wafer 2 is cut into stripes along the lines 5b arranged along the A-plane of the single-crystal sapphire substrate 1.

Subsequently, as illustrated in FIG. 18(b), the knife edge 28 is pressed against the wafer 2 from the semiconductor layer 17 side through the protective tape 24 along the line 5a. This lets the fracture 26a extend to the semiconductor layer 17 side and divides the semiconductor layer 17 together with the single-crystal sapphire substrate 1. That is, the wafer 2 is cut into stripes along the lines 5a arranged along the M-plane of the single-crystal sapphire substrate 1.

Figure 19:
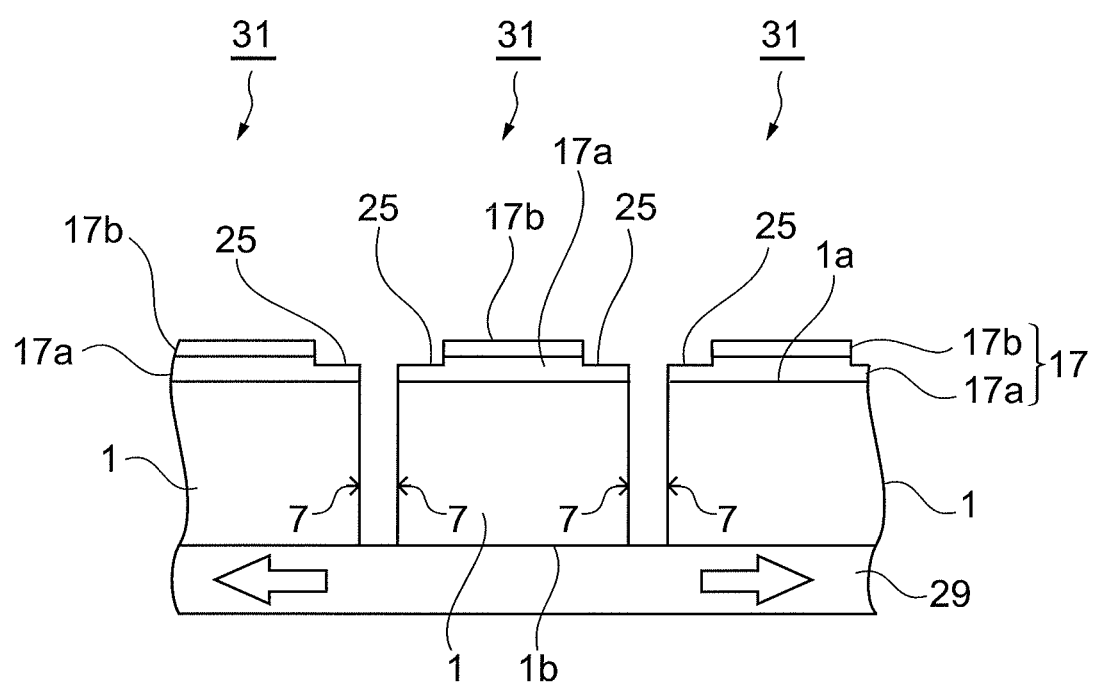
FIG. 19 is a partially sectional view of the wafer for explaining the light-emitting device manufacturing method.

Next, as illustrated in FIG. 19, an expandable tape 29 is attached to the principal surface 1b of the single-crystal sapphire substrate 1, and the protective tape 24 is removed from the wafer 2. Then, the expandable tape 29 is expanded, so that light-emitting diodes 31 formed by cutting the wafer 2 into a plurality of chips are separated from each other. Each light-emitting diode 31 has a pn junction between the n-type semiconductor layer 17a and the p-type semiconductor layer 17b. The bottom face of the groove 25 remaining in the light-emitting diode 31 may be provided with an electrode electrically connected to the n-type semiconductor layer 17a when necessary.

As explained in the foregoing, the light-emitting device manufacturing method in accordance with this embodiment can cut the wafer 2 including the single-crystal sapphire substrate 1 efficiently with a high precision because of the following reasons.

A plurality of modified parts are formed at a first formation pitch for the lines 5a arranged along the M-plane of the single-crystal sapphire substrate 1, while a plurality of modified parts are formed at a second formation pitch narrower than the first formation pitch for the lines 5b arranged along the A-plane of the single-crystal sapphire substrate 1. Thus forming the modified parts inhibits both of the fracture 26a occurring from the modified region 7a formed along the line 5a and the fracture 26b occurring from the modified region 7b formed along the line 5b from meandering.

This is based on the finding that the fracture 26b occurring from the modified region 7b formed along the line 5b tends to meander greatly when a plurality of modified parts are formed at the first formation pitch for the line 5b as for the line 5a. This seems to be because the single-crystal sapphire substrate 1 is harder to cleave (requires a greater cutting force) along the line 5b arranged along the A-plane of the single-crystal sapphire substrate 1 than along the line 5a arranged along the M-plane of the single-crystal sapphire substrate 1.

At the time of irradiation with the pulsed laser light L, the modified region 7a is formed within the single-crystal sapphire substrate 1 such that the fracture 26a occurring from the modified region 7a reaches the principal surface 1b serving as the laser light entrance surface of the wafer 2, and that the modified region 7b is formed within the single-crystal sapphire substrate 1 such that the fracture 26b occurring from the modified region 7b reaches the principal surface 1b serving as the laser light entrance surface of the wafer 2. This makes it possible to cut the wafer 2 with a high precision by a relatively small force when the knife edge 28 is pressed against the wafer 2 along the lines 5a, 5b. Also, since the knife edge 28 is pressed against the wafer 2 from the side of the single-crystal sapphire substrate 1 opposite from the principal surface 1b of the single-crystal sapphire substrate 1 where the fractures 26a, 26b have reached, it becomes easier for the fractures 26a, 26 to extend to the semiconductor layer 17 side by opening themselves.

When forming the modified regions 7a, 7b, the modified region 7b is formed along the line 5b set along the A-plane of the single-crystal sapphire substrate 1, and then the modified region 7a is formed along the line 5a set along the M-plane of the single-crystal sapphire substrate 1. As mentioned above, it is desirable that, for the line 5b set along the A-plane, a plurality of modified parts be formed more precisely at the second formation pitch narrower than the first formation pitch. Therefore, forming the modified region 7b before forming the modified region 7a can prevent the modified region 7a from blocking the irradiation of the laser light L for forming the modified region 7b in the part where the line 5b intersects the line 5a. This can more effectively inhibit the fracture 26b occurring from the modified region 7b formed along the line 5b from meandering.

At the time of irradiation with the pulsed laser light L, the converging point P of the pulsed laser light L is relatively moved along the line 5a at the first relative speed and along the line 5b at the second relative speed slower than the first relative speed. As a consequence, the first formation pitch and the second formation pitch narrower than the first formation pitch can be regulated easily and accurately.

At the time of cutting, the wafer 2 is cut into stripes along the lines 5b arranged along the A-plane of the single-crystal sapphire substrate 1 and then into chips along the lines 5a arranged along the M-plane of the single-crystal sapphire substrate 1. This can reduce the force required for cutting the wafer 2 along the lines 5b and improve the precision of cutting the wafer 2 along the lines 5b. This is based on the finding that a greater cutting force is required (the force required for cutting increases) when the modified region 7b formed along the A-plane is used as a cutting start region than when the modified region 7a formed along the M-plane is used as a cutting start region. This is also because a greater cutting force is required for cutting the wafer 2 along the lines 5b in the state where the wafer 2 has been cut along the lines 5a than for cutting the wafer 2 along the lines 5b in the state where the wafer 2 has not been cut along the lines 5a.

There is a case where it is preferred for the wafer 2 to be cut into chips along the lines 5b set along the A-plane of the single-crystal sapphire substrate 1 after cutting the wafer 2 into stripes along the lines 5a set along the M-plane of the single-crystal sapphire substrate 1. Since a plurality of modified parts are formed for each of the lines 5a at the first formation pitch wider than the second formation pitch, cutting the wafer 2 along the lines 5a in the state where the wafer 2 has been cut along the lines 5b may lower the precision of cutting the wafer 2 along the lines 5a. Since a plurality of modified parts are formed for each of the lines 5b at the second formation pitch narrower than the first formation pitch, by contrast, cutting the wafer 2 along the lines 5b in the state where the wafer 2 has been cut along the lines 5a may inhibit the precision of cutting the wafer 2 along the lines 5b from decreasing. Therefore, cutting the wafer 2 from the modified regions 7a acting as a start point before cutting the wafer 2 from the modified regions 7b acting as a start point can improve the precision of cutting the wafer 2 along the lines 5a while restraining the precision of cutting the wafer 2 along the lines 5b.

Table 1 illustrates results of experiments concerning the relationship between the formation pitch and the state of fractures. For the experiments, a single-crystal sapphire substrate having a thickness of 100 μm was prepared. While the distance from the principal surface serving as a laser light entrance surface in the single-crystal sapphire substrate to a converging point of a pulsed laser light was set to 32 μm, the converging point of the pulsed laser light was relatively moved along lines to cut. This formed one row of a modified region along one line to cut. At this time, the energy of the pulsed laser light was set to 3 P.

Here, HC means a state where, along the line, a fracture occurring from a modified region reaches the principal surface serving as the laser light entrance surface in the single-crystal sapphire substrate. Meander means the maximum range in which a cut section of the single-crystal sapphire substrate cut from the modified region acting as a start point shifts in a direction perpendicular to the line.

As illustrated in Table 1, the lines arranged along the M-plane exhibited HC and suppressed the meander to 7 μm when the formation pitch was 8 μm and 10 μm. On the other hand, the lines arranged along the A-plane exhibited HC and suppressed the meander to 6 μm when the formation pitch was 6 μm. These have shown it preferable to form a plurality of modified parts at the first formation pitch for lines to cut arranged along the M-plane of the single-crystal sapphire substrate and a plurality of modified parts at the second formation pitch narrower than the first formation pitch for lines to cut arranged along the A-plane of the single-crystal sapphire substrate.

TABLE 1

| | Formation pitch | | | | | |
|---|---|---|---|---|---|---|
| | 6 μm | | 8 μm | | 10 μm | |
| | HC | Meander | HC | Meander | HC | Meander |
| Line to cut along M-plane | no | 10 μm | yes | 7 μm | yes | 7 μm |
| Line to cut along A-plane | yes | 8 μm | yes | 9 μm | no | 14 μm |

Figure 20:
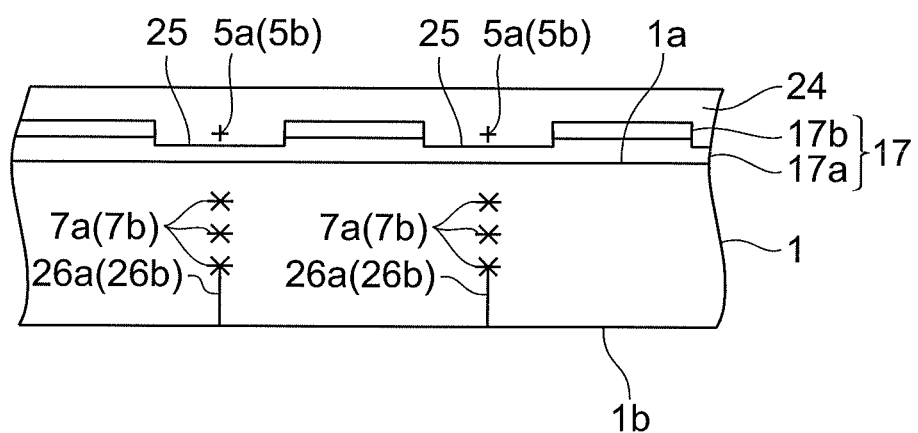
FIG. 20 is a partially sectional view of the wafer for explaining a modified example of the light-emitting device manufacturing method in accordance with the embodiment.

While embodiments of the present invention have been explained in the foregoing, the present invention is not limited to the above-mentioned embodiments. For example, as illustrated in FIG. 20, a plurality of rows of modified regions 7a (7b) may be formed with respect to one line to cut 5a (5b) such as to align in the thickness direction of the single-crystal sapphire substrate 1. This makes it possible to break and cut the wafer 2 with a smaller force even when the single-crystal sapphire substrate 1 is relatively thick.

Figure 21:
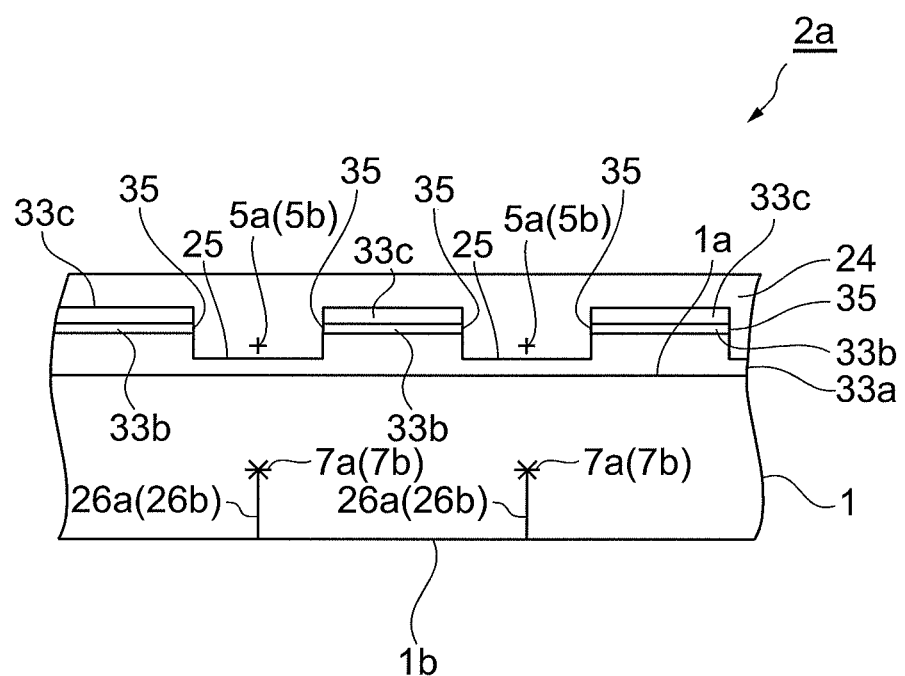
FIG. 21 is a partially sectional view of the wafer for explaining another modified example of the light-emitting device manufacturing method in accordance with the embodiment.

A semiconductor laser can also be manufactured as a light-emitting device. In this case, as illustrated in FIG. 21, a wafer 2a includes a single-crystal sapphire substrate 1, an n-type semiconductor layer 33a which is a first conduction type semiconductor layer laminated on a principal surface 1a of the single-crystal sapphire substrate 1, an active layer 33b laminated on the n-type semiconductor layer 33a, and a p-type semiconductor layer 33c which is a second conduction type semiconductor layer laminated on the active layer 33b. The n-type semiconductor layer 33a, active layer 33b, and p-type semiconductor layer 33c are made of a group III-V compound semiconductor such as GaN, for example, and constitute a quantum well structure. At first, thus constructed wafer 2a is formed with grooves 25 along the lines 5a (5b) by such a depth as to extend from the p-type semiconductor layer 33c to somewhere within the n-type semiconductor layer 33c, whereby resonance surfaces 35 opposing each other through the active layer 33b are formed. Thereafter, the wafer 2a may be cut along lines to cut as in the above-mentioned method for manufacturing the light-emitting diode 31.

As a material for the semiconductor layers, not only GaN but also other group III-V compound semiconductors such as GaAlAs, GaAlAsP, and GaAlInP can be used.

Figure 22:
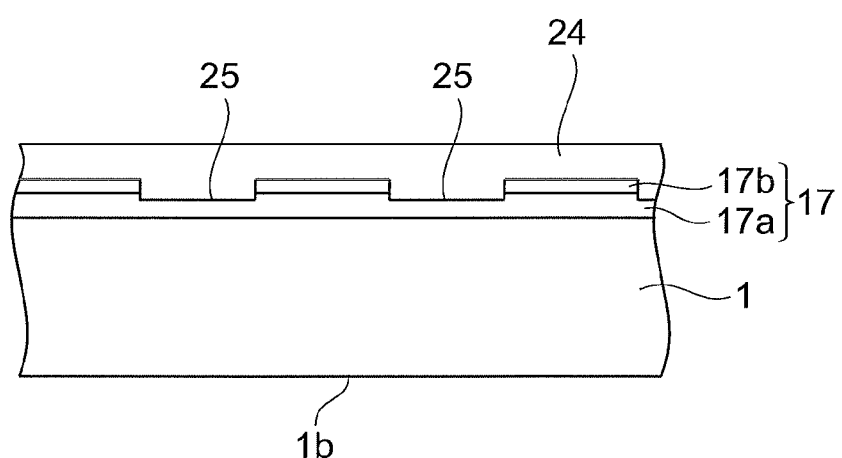
FIG. 22 is a partially sectional view of the wafer illustrating an example of methods for polishing the rear face of the substrate.
Figure 22:
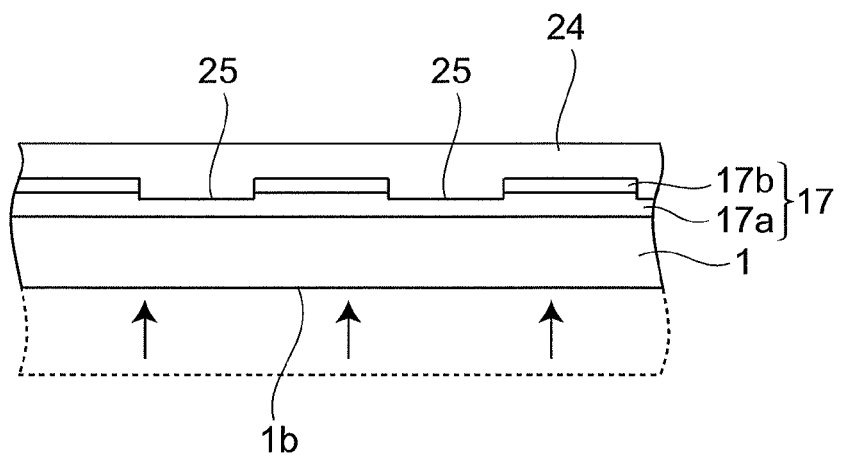

Before forming the modified region, the single-crystal sapphire substrate may be thinned by polishing the principal surface thereof. In this case, as illustrated in FIG. 22(a), the protective tape 24 is attached to the wafer 2 such as to cover the semiconductor layer 17. Then, as illustrated in FIG. 22(b), the principal surface 1b of the single-crystal sapphire substrate 1 is polished, so as to thin the single-crystal sapphire substrate 1 to a predetermined thickness.

While the p-type semiconductor layer, active layer, and n-type semiconductor layer are laminated as semiconductor layers on the single-crystal sapphire substrate in the above-mentioned embodiment, they may further be laminated with a contact layer for electrical connection with an electrode and the like. While the first and second conduction types have been defined as n and p types, respectively, the first and second conduction types may be p and n types, respectively.

The modified regions may be formed not only by multiphoton absorption but also by other kinds of optical absorption, such as photoabsorption corresponding to the multiphoton absorption, and thermal influences. That is, the multiphoton absorption is an example of phenomena which can form modified regions.

As explained in the foregoing, the laser processing method and light-emitting device manufacturing method in accordance with the present invention can cut a wafer including a single-crystal sapphire substrate efficiently with a high precision.

What is claimed is:

1. A laser processing method for cutting a wafer including a single-crystal sapphire substrate having a C-plane as a principal surface along first and second lines to cut the wafer, the method comprising:
   a first step of irradiating the single-crystal sapphire substrate with a pulsed laser light while locating a converging point within the substrate, and relatively moving the converging point of the pulsed laser light along the first line arranged along an M-plane of the single-crystal sapphire substrate, so as to form a first modified region within the single-crystal sapphire substrate along the first line; and
   a second step of irradiating the single-crystal sapphire substrate with the pulsed laser light while locating the converging point within the substrate, and relatively moving the converging point of the pulsed laser light along the second line arranged along an A-plane of the single-crystal sapphire substrate, so as to form a second modified region within the single-crystal sapphire substrate along the second line;
   wherein, in the first step, a modified part is formed by irradiation with one pulse of the pulsed laser light, and a plurality of the modified parts are arranged at a first formation pitch along the first line, so as to form the first modified region;
   wherein, in the second step, a plurality of the modified parts are arranged with a second formation pitch narrower than the first formation pitch along the second line, so as to form the second modified region, wherein
   the first formation pitch is a value obtained by dividing a first relative speed of the pulsed laser light by a repetition frequency of the pulsed laser light in the first step, and
   the second formation pitch is a value obtained by dividing a second relative speed of the pulsed laser light by a repetition frequency of the pulsed laser light in the second step.

2. A laser processing method according to claim 1, wherein the first step is carried out after the second step.

3. A laser processing method according to claim 1, wherein, in the first step, the converging point of the pulsed laser light is relatively moved at a first relative speed along the first line; and wherein, in the second step, the converging point of the pulsed laser light is relatively moved at a second relative speed slower than the first relative speed along the second line.

4. A laser processing method according to claim 1, wherein, in the first step, the first modified region is formed within the single-crystal sapphire substrate such that a first fracture occurring from the first modified region reaches a laser light entrance surface of the wafer; and wherein, in the second step, the second modified region is formed within the single-crystal sapphire substrate such that a second fracture occurring from the second modified region reaches the laser light entrance surface of the wafer.

5. A laser processing method according to claim 4, further comprising:

a third step of pressing a knife edge against the wafer along the first line from an opposite side of the laser light entrance surface, so as to cut the wafer along the first line; and a fourth step of pressing the knife edge against the wafer along the second line from the opposite side of the laser light entrance surface, so as to cut the wafer along the second line.

6. A laser processing method according to claim 5, wherein the third step is carried out after the fourth step.

7. A laser processing method according to claim 5, wherein the fourth step is carried out after the third step.

8. A method for manufacturing a plurality of light-emitting devices by cutting a wafer along first and second lines to cut the wafer, the wafer including a single-crystal sapphire substrate having a C-plane as a principal surface and a semiconductor layer made of a group III-V compound semiconductor and laminated on one principal surface of the single-crystal sapphire substrate, the method comprising:

a first step of irradiating the single-crystal sapphire substrate with a pulsed laser light while locating a converging point within the substrate, and relatively moving the converging point of the pulsed laser light along the first line arranged along an M-plane of the single-crystal sapphire substrate, so as to form a first modified region within the single-crystal sapphire substrate along the first line such that a first fracture occurring from the first modified region reaches the other principal surface of the single-crystal sapphire substrate;

a second step of irradiating the single-crystal sapphire substrate with the pulsed laser light while locating the converging point within the substrate, and relatively moving the converging point of the pulsed laser light along the second line arranged along an A-plane of the single-crystal sapphire substrate, so as to form a second modified region within the single-crystal sapphire substrate along the second line such that a second fracture occurring from the second modified region reaches the other principal surface of the single-crystal sapphire substrate;

a third step of pressing a knife edge against the wafer along the first line from the semiconductor layer side, so as to cut the wafer along the first line; and a fourth step of pressing the knife edge against the wafer along the second line from the semiconductor layer side, so as to cut the wafer along the second line;

wherein, in the first step, a modified part is formed by irradiation with one pulse of the pulsed laser light, and a plurality of the modified parts are arranged at a first formation pitch along the first line, so as to form the first modified region;

wherein, in the second step, a plurality of the modified parts are arranged with a second formation pitch narrower than the first formation pitch along the second line, so as to form the second modified region, wherein the first formation pitch is a value obtained by dividing a first relative speed of the pulsed laser light by a repetition frequency of the pulsed laser light in the first step, and the second formation pitch is a value obtained by dividing a second relative speed of the pulsed laser light by a repetition frequency of the pulsed laser light in the second step.

9. A method according to claim 8, wherein the first step is carried out after the second step.

10. A method according to claim 8, wherein, in the first step, the converging point of the pulsed laser light is relatively moved at a first relative speed along the first line; and wherein, in the second step, the converging point of the pulsed laser light is relatively moved at a second relative speed slower than the first relative speed along the second line.

11. A method according to claim 8, wherein the third step is carried out after the fourth step.

12. A method according to claim 8, wherein the fourth step is carried out after the third step.

* * * * *